Figure 1:
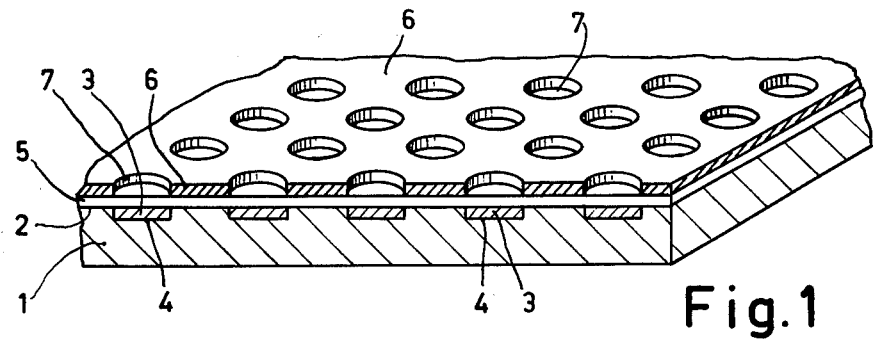

United States Patent [19]

Hoeberechts et al.

[11] 4,038,606

[45] July 26, 1977

[54] SEMICONDUCTOR DEVICE FOR STORING AND NON-DESTRUCTIVELY READING IMAGE INFORMATION AND MEMORY SYSTEM COMPRISING SUCH A DEVICE

[75] Inventors: Arthur Marie Eugene Hoeberechts; Marino Giuseppe Carasso, both of Eindhoven, Netherlands

[73] Assignee: U.S. Philips Corporation, New York, N.Y.

[21] Appl. No.: 749,742

[22] Filed: Dec. 13, 1976

Related U.S. Application Data

[63] Continuation of Ser. No. 541,444, Jan. 16, 1975, abandoned.

[30] Foreign Application Priority Data

Feb. 14, 1974 Netherlands .................. 7402013

[51] Int. Cl.² .............................................. G11C 11/34
[52] U.S. Cl. ..................................... 328/124; 357/31; 307/303
[58] Field of Search .................. 328/123, 124; 357/23, 357/30, 31; 307/303

[56] References Cited

U.S. PATENT DOCUMENTS

| 3,430,213 | 2/1969 | Shoulders | 328/124 X |
| 3,604,987 | 9/1971 | Assour | 357/30 X |
| 3,675,134 | 7/1972 | Luedicke et al. | 328/124 |
| 3,748,585 | 7/1973 | Culter et al. | 328/124 |
| 3,793,571 | 2/1974 | Janssen | 357/30 |
| 3,829,887 | 8/1974 | Katow | 357/31 |

Primary Examiner—John S. Heyman
Attorney, Agent, or Firm—Frank R. Trifari; Carl P. Steinhauser

[57] ABSTRACT

A semiconductor device, in particular a target for use in a memory tube having an optical and electric input and an electric output, having a semiconductor plate of the silicon vidicon type, in which information in the form of charge is stored in an insulating layer present on the diodes and is read non-destructively by scanning a reading grating present on the insulating layer between the diodes by means of an electron beam.

10 Claims, 10 Drawing Figures

SEMICONDUCTOR DEVICE FOR STORING AND NON-DESTRUCTIVELY READING IMAGE INFORMATION AND MEMORY SYSTEM COMPRISING SUCH A DEVICE

This is a continuation of application Ser. No. 541,444, filed Jan. 16, 1975 now abandoned.

The invention relates to a semiconductor device having an electric and optical input and an electric output for the non-destructive reading of information written in via the input and comprising a semiconductor target having a substrate of a first conductivity type at a surface of which a regular pattern of island-shaped zones (islands) of the second conductivity type is provided which constitute p-n junctions with the adjoining part of the target, said surface being at least partly covered with an electrically insulating layer.

The invention furthermore relates to a transceiver memory system comprising such a device.

It is to be noted that in this application the expressions optical input, optical writing, radiation and radiation pattern, respectively, do not only relate to visible radiation but should be considered in a broad sense, including infrared and ultraviolet radiation.

Devices by means of which image information can be stored in the form of a charge pattern and read out afterwards in a non-destructive manner are known. In the last few years, simple target structures have been developed for use in such so-called memory tubes, in which the image information which is presented in the form of a radiation pattern is stored on the target in the form of electric charge on parts of a dielectric layer, preferably an oxide layer of, for example, silicon dioxide.

A first known structure has been described in International Solid State Conference 1970, pp. 30–31 and IEEE Transactions on Electron devices, vol. ED 18, 1971, pp. 229–235. The target described in said papers consists of a silicon layer on which a regular pattern of silicon dioxide has been provided. The oxide forms a large number of storage elements, in which charge can be stored in the capacitor formed by each oxide element, of which capacitor the substrate is one of the electrodes. The oxide pattern is first scanned by an electron beam in which the pattern is at a positive potential relative to the electron gun as a result of a comparatively high positive voltage applied to the target, the secondary emission coefficient, however, being smaller than 1. Secondary emission coefficient is to be understood to mean herein as is usual the number of secondary electrons divided by the number of primary incident electrons, see, for example, Kazan and Knoll, Electronic Image Storage, Academic Press 1968, p.3. As a result of this the oxide pattern is charged negatively. When the positive voltage at the target is sufficiently reduced, the oxide pattern assumes a negative potential relative to the electron source so that the electrons cannot reach the target. For writing information, the target is brought to such a high positive voltage relative to the electron source that the secondary emission coefficient is larger than 1. By scanning with an electron beam which is modulated by a video signal, a charge pattern is formed on the oxide which corresponds to the original radiation pattern from which the video signal has been derived. For reading, the potential of the target is then reduced to a comparatively low positive value relative to the electron source, after which the oxide pattern is scanned by the electron beam. The electron current to the target is modulated by the acceptance differences which arise due to the differences in charge on the oxide pattern, so that an electric output signal is obtained. Since the negative charge remains present on the oxide pattern for a long time as a result of the fact that scanning is carried out with electrons read-out in non-destructive. A memory tube having such a target has an electric input and an electric output.

Although the structure of the described known target is very simple, a memory tube having such a target has inter alia the drawback that the change pattern can be provided only electrically. Thus such a memory tube must always be used in combination with a camera tube which converts the radiation pattern into electric signals.

Another known target by which the radiation pattern can be provided not only electrically, but also directly optically so that a separate camera tube is not required, is described in NTZ 1972, Heft 8, pp.369–373. Said target resembles in many respects the known silicon-vidicon and consists of an n-type silicon plate in which a pattern of p-type islands which form planar diodes is provided at one surface. Between the diodes the surface is covered with a silicon oxide layer, while a metal contact is provided on the diodes and covers the diode surface entirely. Said target comprises two capacities for charge storage, namely the diode capacity and the capacity of the oxide between the diodes, which two capacities have the substrate as a common electrode. For the lasting storage of a charge pattern which can be read-out non-destructively many times, the capacity of the oxide layer between the diodes is used in this target. The writing of the charge pattern can be effected in this case either electrically (via the electron beam) or optically (via the diodes). The reading is carried out electrically by means of the electron beams.

Although with the last-mentioned device writing of information can take place either optically or electrically, this device also exhibits a number of drawbacks. For example, the dark current is rather high and the target has a poor dynamic range since in the optical writing the intensity only of the reverse current generated by the radiation is decisive of the written charge and not the time during which the scene is on the target. As a result of this the device cannot be used at low radiation intensities. Furthermore it is essential both in this target and in the above-described target that the substrate should be accessible for the electron beam (directly in the first described target, via the metal contact and the diode in the last-mentioned target). As a result of this the said targets are sensitive and vulnerable to the X-ray radiation which is always produced in memory tubes as a result of the electron beam impinging upon metal parts present in the tube. In the long run the quality of the target may be seriously degraded by said X-ray radiation. Due to the contradictory requirements which are imposed upon the construction of the target for electric writing and for optical writing, a compromise for optimum operation both for electric and optical writing is moreover very difficult to realise.

One of the objects of the invention is to provide a new construction for a target and a memory tube having a target, respectively, in which writing can be carried out either optically or electrically under optimum conditions and in which the target can be shielded efficaciously against the action of X-ray radiation. Another object of the invention is to provide a memory tube having a target which can be used even at very low radiation intensity.

The invention is inter alia based on the discovery that this object can be achieved by replacing the substrate as an electrode for the memory capacity by an individual read-out electrode which enables a very efficient construction of the target which could otherwise not be realised or could be realized with great difficulty only.

Therefore, a semiconductor device of the kind described in the preamble has according to the invention, and insulating layer which extends at least on the said islands and that a readily conducting layer in the form of a coherent read-out grating is present on the insulating layer, an aperture being present in the read-out grating above each island and leaving exposed at least a part of the insulating layer present on the island. When the said target is mounted in a memory tube it requires at most only one extra output (for the read-out grating). On the other hand, such a target is relatively in sensitive to X-ray radiation generated in the memory tube as a result of the shielding action of the read-out grating present on the insulating layer. In addition to the important advantage that in this device optical writing of information requires only a very low radiation intensity, which will be explained in detail hereinafter, a memory tube having a target according to the invention presents the advantage that the tube upon transferring images can be used as a memory tube both at the recording end and at the display end, so that a separate camera tube at the recording end is usually superfluous.

The apertures in the grating may, for example, leave only a part of the islands exposed. Preferably, however, the edges of the apertures in the grating coincide in projection substantially with the edges of the islands. As a result of this a technically favourable fraction of the target is occupied by the read-out grating.

The target is preferably of n-type silicon but, if desired, it may also consist of other semiconductor materials. The insulating layer consists preferably of an oxide, for example silicon oxide, but may also be formed by silicon nitride, other oxides, such as $Al_2O_3$, or other insulating layers. The read-out grating may be of metal but according to a preferred embodiment it consists of polycrystalline silicon which is preferably doped.

According to a preferred embodiment the device is a memory tube comprising an electron source which can generate an electron beam with which the said target can be scanned. The device advantageously comprises means to cause radiation to be incident on the target for optically writing information.

The device according to the invention may be written and non-destructively read out, in which the device comprises means to cause radiation to be incident on the target for optically writing information. The device is particularly advantageously written optically in a manner which is characterized in that for writing information first the insulating layer is charged positively by secondary omission, that the substrate is then brought at a positive potential relative to the electron source, in which the secondary omission coefficient is smaller than 1, after which the target is scanned by an electron beam so that a charge pattern corresponding to the radiation pattern is obtained at the surface of the insulating layer on the islands, which can then be read-out electrically and non-destructively by scanning the read-out grating with the electron beam.

The invention furthermore relates to a transmitting and receiving stem which comprises a memory tube according to the invention both at the transmitter end and at the receiver end, in which the memory tube can be written optically and/or electrically and non-destructively read-out electrically at one end, and in which the memory tube can be written electrically and be non-destructively read-out electrically at the other end.

The invention will now be described in greater detail with reference to a few embodiments.

Figure 2:
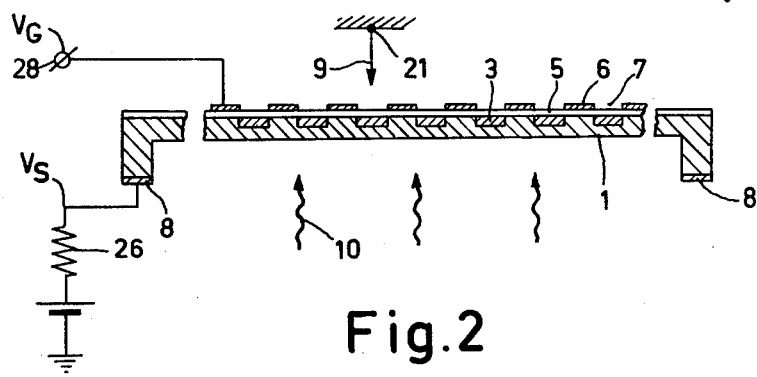

FIG. 1 is a perspective cross-sectional view through the active part of a device according to the invention, FIG. 2 is a diagrammatically cross-sectional view through the whole target of FIG. 1.

Figures 3, 4:
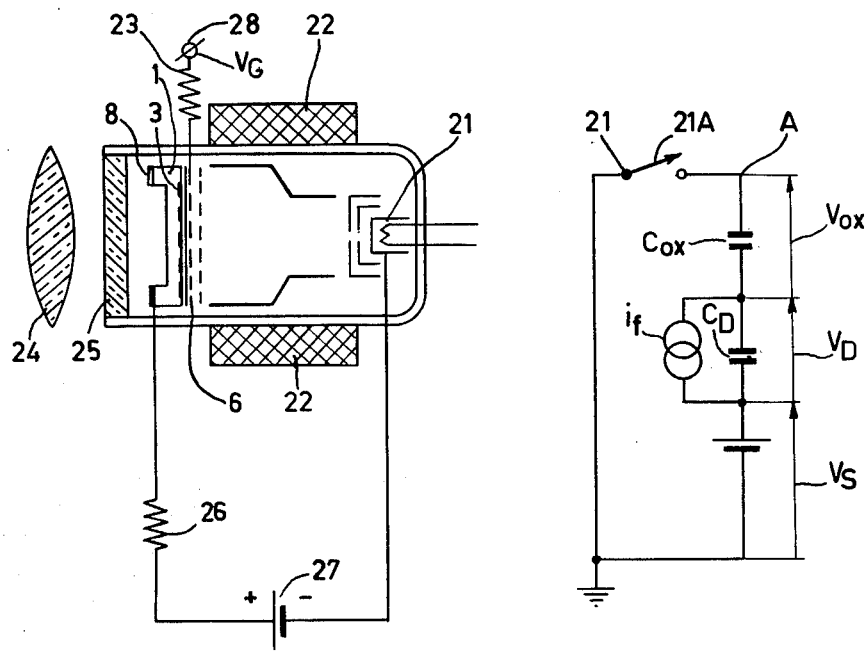
Figure 5:
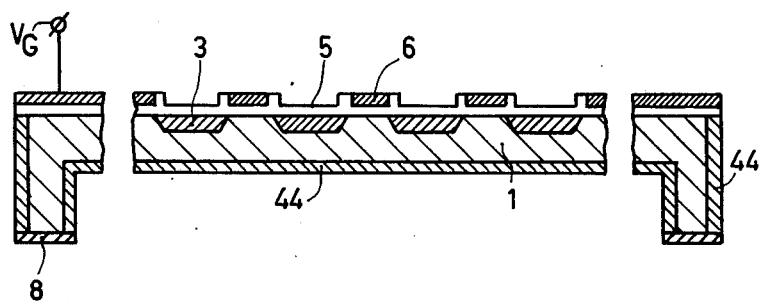
Figure 6:
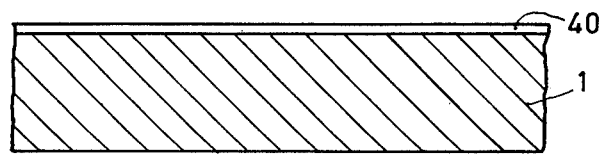
Figure 10:
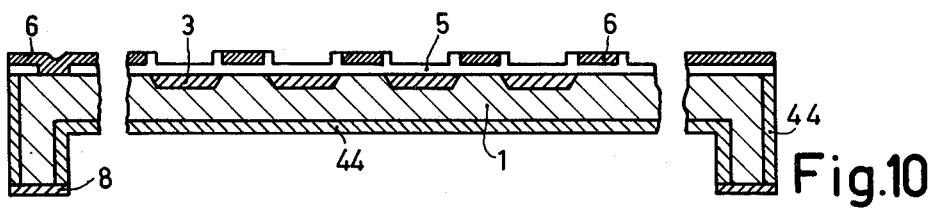

FIG. 3 is a diagrammatic cross-sectional view of a memory tube with target according to the invention, FIG. 4 shows diagrammatically the circuit arrangement with the various capacities and voltages of a device according to the invention, FIG. 5 shows a preferred embodiment of a device according to the invention, FIGS. 6 to 9 show the device of FIG. 4 in successive stages of manufacture, FIG. 10 is a diagrammatic cross-sectional view of a variation of a device according to the invention.

The Figures are diagrammatic and not drawn to scale. Corresponding parts generally have the same reference numerals. Semiconductor regions of the same conductivity type are normally shaded in the same direction.

FIG. 1 is a perspective cross-sectional view through a target according to the invention. The target comprises an n-type conductive silicon plate 1 at a surface 2 of which a regular pattern of island-shaped p-type conductive zones 3 is provided which form p-n junctions 4 with the adjoining part of the semiconductor plate. The surface 2 is covered with an electrically insulating layer 5 of silicon oxide.

According to the invention, the insulating layer 5 extends over the islands 3; in this example the layer 5 is provided over the entire surface 2. According to the invention there is furthermore present on the insulating layer 5 a readily conducting layer 6, in this example a molybdenum layer, in the form of a coherent read-out grating, an aperture 7 being present in the read-out grating 6 above each island 3 and leaving exposed a part of te insulating layer 5 present on the island 3. In the present case the edge of the apertures 7 substantially coincides in projection with the edge of the islands 3. In this example the islands are circular but, of course, they may be square or have a different shape.

For clarity, FIG. 1 shows only a part of the target having a small number of islands (or diodes). FIG. 2 is a cross-sectional view, which is partly interrupted, through the whole target from which it is obvious inter alia that the edge of the plate is locally thickened and comprises a connection contact 8 to bring the substrate at a desired potential relative to the source (cathode) 21 of the electron beam 9.

FIG. 3 is a diagrammatic cross-sectional view of a memory tube according to the invention which comprises a target as described above. The memory tube comprises an electron source in the form of an electron gun 21 which can generate an electron beam with which the target 1 can be scanned by deflection of the electron beam by means of a system of coils 22 suitable for that purpose. The optical system 24 can form a radiation image on the target 1 via the glass plate 25. On its side remote from the radiation-sensitive diodes 3 the target 1 comprises at its edge the annular connection contact 8 which in the operating condition is connected, via the resistor 26, to the positive terminal of a voltage source 27 whose negative terminal is connected to the electron source 21. The read-out grating 6 is connected to the connection terminal 28 via a lead-through and via the resistor 23.

It is to be noted that the read-out grating 6 may be connected directly to the substrate 1, if desired which makes an extra lead-through from the tube superfluous. This may be carried out in a simple manner, for example, by means of a metal track connecting the substrate to the lead-out grating 6, or by causing the read-out grating 6 itself to adjoin the substrate 1 via an aperture in the insulating layer 5.

The target and the memory tube, respectively according to the invention may be operated as follows

A. Erasing information still present

Such a high positive potential $V_S$ relative to the cathode (electron gun) 21, for example 20 V, is set up at the substrate 1 that, at a given positive potential $V_G$ of the read-out grating 6 relative to the cathode, the oxide 5 can be reached everywhere by the electron beam and obtains a uniform potential.

B. Positive charging of the oxide

For this purpose, the potential $V_S$ of the substrate 1 is still further increased, namely to a value of, for example, 250 V, at which a secondary emission coefficient > 1 occurs, that is to say that more electrons leave the target than impinge on it. As a result of this the oxide 5 on the diodes 3 is charged positively. During this operation the target may be in the dark or an illumination pattern (scene) may be present on the target.

C. Writing information

This may occur optically or electrically.

For writing optically, the potential of the substrate is reduced to a value at which the secondary emission coefficient is smaller than 1. Hereinafter there will be started from an initial situation where the potential of the oxide surface is assumed to be equal to zero and a certain reverse voltage is applied across the diode.

A radiation pattern (10, FIG. 2) is presented, the reverse current $i_f$ of the diodes being influenced in accordance with the radiation intensity so that the diodes will locally be discharged to a greater or smaller extent. When the target is scanned by the electron beam, a redistribution of the voltage across the series arrangement of the oxide capacity $C_{ox}$ and the diode capacity $C_D$ takes place, which will be explained in detail with reference to FIG. 4.

FIG. 4 shows diagrammatically the voltage $V_{ox}$ across the oxide capacity $C_{ox}$, the voltage $V_D$ across the diode capacity $C_D$, and the substrate voltage $V_s$ relative to the cathode 21. The voltages are assumed to be positive in the direction of the arrows. Then it holds for the voltage $V_A$ of the oxide surface relative to the cathode 21 that: $V_A = V_D + V_{ox} + V_S$. The diode reverse current $i_f$ generated under the influence of radiation is denoted in FIG. 4 as a current source, the electron beam as an arrow 21A starting from the cathode 21.

During irradiation, the diode capacity is discharged and the (negative) diode voltage $V_D$ varies according to the equation:

$$V_D(t) = V_D(o) + \frac{i_f \cdot t}{C_D}$$

Wherein $t$ is the time expired since the beginning of the irradiation.

Upon scanning of the diode by the beam, the said voltages vary according to the equation $$\Delta V_A = \Delta V_{ox} + \Delta V_D$$

wherein $$\Delta V_A = -\frac{i_f \cdot t}{C_D}$$

while $$\frac{\Delta V_{ox}}{\Delta V_D} = \frac{C_D}{C_{ox}}$$

From this it follows that:

$$\Delta V_{ox} = -\frac{i_f \cdot t}{C_D + C_{ox}}$$

Thus during writing optically a quantity of charge is transferred in a given period of time $t$ from the diode capacity $C_D$ to the oxide capacity $C_{ox}$ which quantity is proportional to the product of the diode reverse current $i_f$, which depends upon the radiation intensity, and the time $t$ during which the radiation pattern is on the target. When $t$ is chosen to be sufficiently long, there can thus be operated with a very low radiation intensity (low $i_f$).

For writing electrically, the positive charge to be provided on the diode is varied locally by varying, during the positive charging of the oxide, the electron beam intensity according to a video signal.

The result of either the optical writing or the electrical writing is that the oxide capacity $C_{ox}$ present on the diode is charged according to a charge pattern which represents the information and which can then be read-out non-destructively.

At the end of the writing process the diodes are preferably discharged entirely, with the electron beam switched off, for example, by a light flash or by leaving the radiation pattern on the target for some time.

D. Read-out of the information

This is done electrically. It is ensured that the read-out grating 6 is at a positive voltage relative to the cathode 21, for example 8 Volts, which has been chosen to be so that the oxide surface is negative everywhere relative to the cathode. The voltage at the read-out grating will preferably be controlled so that with the given charge pattern a bear of acceptance modulation occurs which is as favourable as possible; this can be seen and controlled with reference to the read image.

The target is scanned with an electron beam of substantially constant intensity, the beam acceptance at a given site of the read-out grating being dependent on the negative surface potential of the oxide present in the immediate proximity of the target point. As a result of this, variations occur in the electron current which flow from the cathode 21 to the read-out grating 6 and the resulting reading signal may be derived via an impedance and be used for reproducing an image stored as an oxide charge. Since the oxide charge leaks away only very slowly, the stored information can be read-out non-destructively many times and be stored for a very long time. If desired, the stored information may be erased again according to the process described sub A.

The described target is substantially insensitive to X-ray radiation which is generated in the described memory tube, since the oxide adjacent the diodes is substantially entirely covered by the read-out grating.

A further important advantage of the tube is that upon transferring images, for example in telephone connections, it may be used both at the recording end and at the playback end as a memory tube, since information can be written either electrically or optically. As a result of this, a separate camera tube is superfluous in many cases at the recording end.

The memory tube may furthermore be manufactured in a simple manner by means of known generally used methods. FIG. 5 is a diagrammatic cross-sectional view of a preferred embodiment of a target according to the invention in which the read-out grating 6 consists of polycrystalline silicon. This can be simply manufactured as follows.

Starting material is an n-type silicon plate 1, for example 200 microns thick, having a diameter of, for example 22 mm and a resistivity of approximately 10 ohm.cm. Said plate is then thermally oxidized, for example at 1200° in dry oxygen for 16 hours. An oxide layer 40 is formed, approximattely 0.8 micron thick, see FIG. 6.

Figure 7:
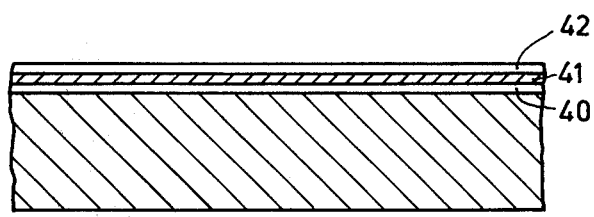
Figure 8:
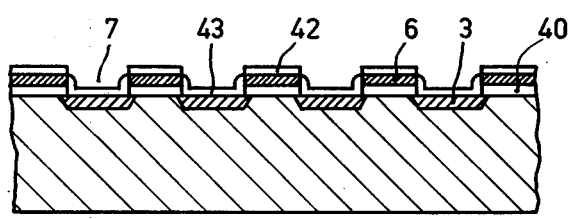
Figure 9:
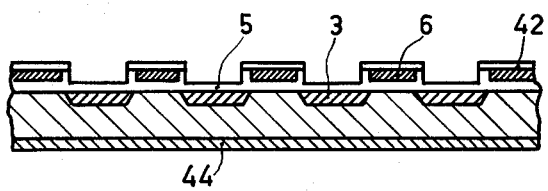

In known manner, for example by chemical decomposition of $SiH_4$, a layer 41 of polycrystalline silicon approximately 0.5 micron thick, is then provided on the oxide layer 5. The layer 41 is preferably p-type doped, having a sheet resistance of, for example, 50 Ohm per square. A layer 42 is silicon nitride, approximately 0.1 micron thick, see FIG. 7, is provided in known manner on said layer 41 by chemical decomposition. By using photolithographic etching methods, the layers 42, 41 and 40 are then etched to form the pattern which corresponds to the read-out grating. Boron is then indiffused through the resulting apertures, a glass layer 43 being formed. As a result of said diffusion, the p-type zones 3, approximately 2 microns thick, are formed, see FIG. 8. Said glass layer 43 may then be etched away and a thermal oxidation be carried out, an oxide layer 5 being formed on the diodes 3 and on the edge of the grating 6. Preferably, however, the glass layer 43 is retained and is used as a memory capacity, so that in this case the layer 5 (see FIG. 9) on the diodes 3 consists of boron-containing glass.

The plate 1, the edge excepted, is then etched thin to a thickness of approximately 10 to 30 microns, after which a phosphorus diffusion is carried out to form a highly doped n-type layer 44 (see FIG. 9) on the side present opposite to the diodes 3, so that a favourable drift field is formed for the holes generated by incident radiation in the direction of the diodes 3, and at the same time a good edge contact 8 (see FIG. 5) can be formed. The phosphorus is also diffused into the layers 42 and 43 and hence contributes to stabilization and to a low reverse (dark) current of the diodes. The nitride layer 42 is finally etched away and there is annealed at 400° in wet nitrogen to compensate for surface states. The target is finally provided with a substrate contact and, if necessary, with a lead-through for the read-out grating, see FIG. 5, after which the target is ready for assembly in a memory tube as is shown in FIG. 3.

It will be obvious that the invention is not restricted to the embodiments given by way of illustration only, but that many variations are possible to those skilled in the art without departing from the scope of this invention. For example, the island-shaped zones may advantageously be formed by means of ion implantation instead of by diffusion. The read-out grating 6 may immediately adjoin the substrate via an aperture in the insulating layer 5, see FIG. 10. The semiconductor body may consist, for example, of germanium, an $A_{III}B_V$ compound or another semiconductor material instead of of silicon. The insulating layer or layers may consist of materials differing from silicon oxide, for example, aluminum oxide or silicon nitride. The conductive material of the read-out grating may also differ from that mentioned in the embodiments, while the manufacture may be carried out in many manners in addition to that described. The invention is by no means restricted to the application possibilities mentioned above. In particular, a memory tube according to the invention may be used to write an X-ray diagram and then read it non-destructively, if desired repeatedly.

What is claimed is:

1. A semiconductor device having an electric and an optical input and an electric output for nondestructively reading information written in via the input and comprising a semiconductor target having a substrate of a first conductivity type, a regular pattern of island-shaped zones of a second conductivity type on one surface of said target, said zones forming p-n junctions with the adjoining part of the target, an electrically insulating layer covering at said surface at least said island-shaped zones, a conductive layer having apertures therein covering said electrically insulating layer and forming a read-out grating, said insulating layer having sufficient thickness to substantially prevent transfer of electrical charges and constitutes a dielectric in which information is stored, an aperture being present in the read-out grating above each island and leaving exposed at least a part of the insulating layer present on the island to permit information stored in said insulating layer to be read out.

2. A semiconductor device as claimed in claim 1, characterized in that between the islands the read-out grating extends entirely on the insulating layer, the edges of the apertures in the grating substantially coinciding in projection with the edges of the islands.

3. A semiconductor device as claimed in claim 1 wherein the insulating layer consists of silicon oxide.

4. A semiconductor device as claimed in claim 1 wherein the read-out grating is a layer of doped polycrystalline silicon.

5. A semiconductor device as claimed in claim 1 wherein the read-out grating is locally connected electrically to the substrate.

6. A semiconductor device as claimed in claim 1 wherein the device is a memory tube comprising an electron source which can generate an electron beam with which the said target can be scanned.

7. A semiconductor device as claimed in claim 6, wherein the device comprises means to project radiation on the target for optically writing information.

8. A semiconductor device as claimed in claim 7, further comprising means for first charging the insulating layer positively by secondary emission, means to bring the substrate to such a positive potential relative to the electron source that the secondary emission coefficient is smaller than 1, means to scan the target with an electron beam so that a charge pattern corresponding to the radiation pattern is obtained at the surface of the insulating layer on the islands for writing information thereon, and means for reading out said charge pattern electrically and non-destructively.

9. A semiconductor device as claimed in claim 8, including means to expose the target to a radiation pattern to optically write information thereon and means to scan the target with the electron beam for reading out the information.

10. A transmitting and receiving memory system, comprising a transmitter and a receiver having a memory tube as claimed in claim 6.

* * * * *